Figure 1:
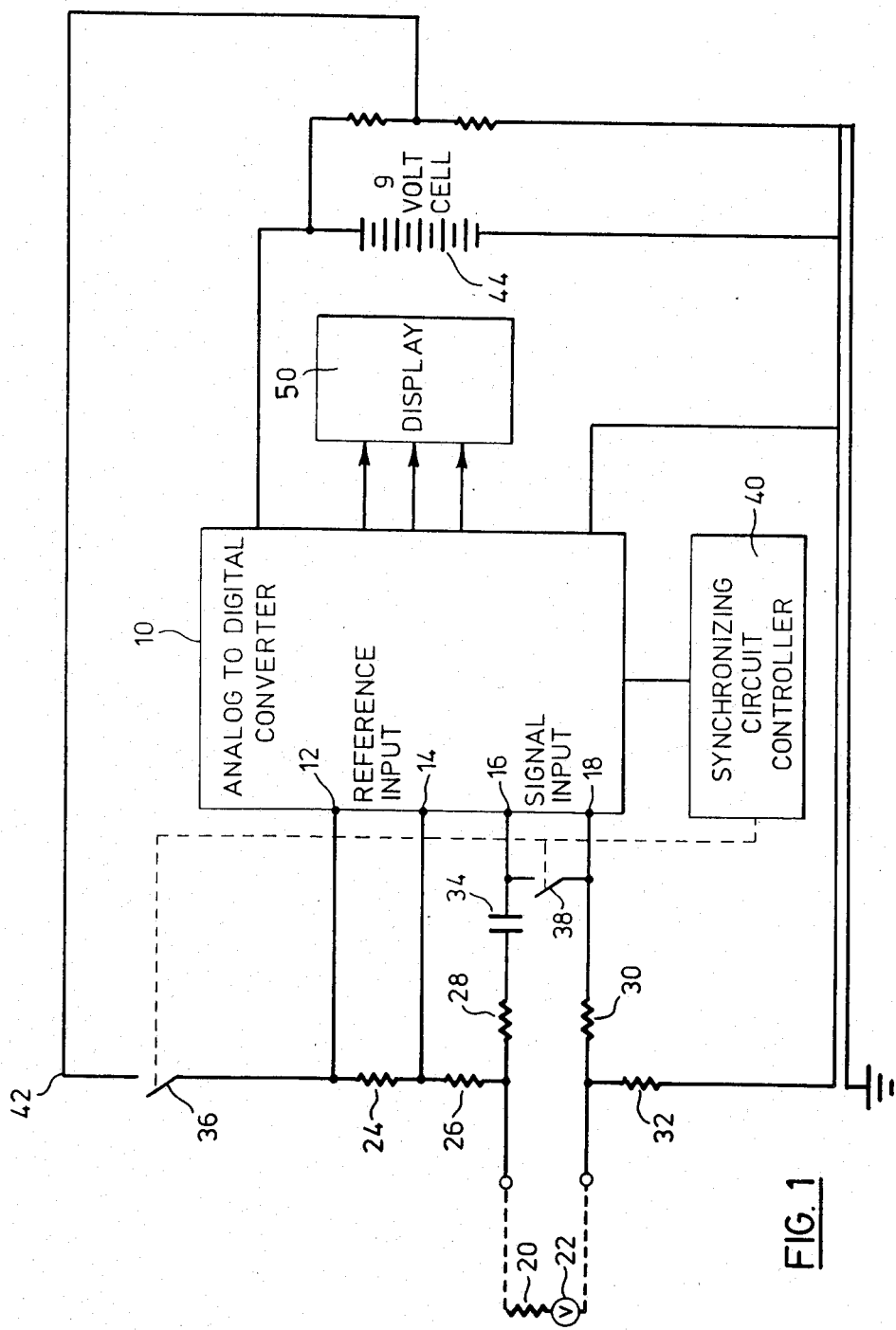

United States Patent [19]

Borkowicz

[11] Patent Number: 4,636,715
[45] Date of Patent: Jan. 13, 1987

[54] DIGITAL DISPLAY OHMMETER
[75] Inventor: Jerzy Borkowicz, Ottawa, Canada
[73] Assignee: C-I-L Inc., North York, Canada
[21] Appl. No.: 752,846
[22] Filed: Jul. 8, 1985
[30] Foreign Application Priority Data Aug. 13, 1984 [CA] Canada ................................. 460884

[51] Int. Cl.[4] ........................................... G01R 27/00
[52] U.S. Cl. ....................................... 324/62; 324/51
[58] Field of Search ............ 324/62, 57 R, 51, 65 CR, 324/65 R

[56] References Cited
U.S. PATENT DOCUMENTS

| | | | |
|---|---|---|---|
| 2,492,459 | 12/1949 | Bondurant | 324/62 |
| 2,536,022 | 1/1951 | Beach et al. | 324/62 |
| 2,543,803 | 3/1951 | Prescott | 324/62 |
| 2,891,219 | 6/1959 | Camp | 324/62 |
| 2,976,485 | 3/1961 | Bartz | 324/51 |
| 3,086,170 | 4/1963 | Kemelhor et al. | 324/62 |
| 3,258,689 | 6/1966 | Ressler et al. | 324/57 R X |
| 3,562,639 | 2/1971 | Wright et al. | 324/51 |
| 3,602,952 | 9/1971 | Grinnell et al. | 324/62 |
| 3,689,830 | 9/1972 | Caldwell et al. | 324/51 |
| 3,906,341 | 9/1975 | Getz et al. | 324/62 |

Primary Examiner—Stanley T. Krawczewicz
Attorney, Agent, or Firm—Donald G. Ballantyne

[57] ABSTRACT

An apparatus and method is provided for measuring the continuity and resistance of electric circuits, particularly electric wire circuits used in blasting, in the presence of spurious voltages due to galvanic currents. A constant current from a cell is passed through the electric circuit to be tested and through a reference resistor where the voltages are measured to derive the resistance of the circuit. The measured voltages are sensed with a converter converted to a resistance measurement and displayed. The presence of spurious voltages is compensated for by connecting a galvanic current storage capacitor in the circuit, passing a reference current through the reference resistor and the circuit and comparing the voltage across the reference resistor with the voltage across the circuit and storage capacitor to derive a resistance reading. The reading is converted to a digital display. The method and apparatus provides a quick, convenient means of testing blasting circuit continuity in the field in the presence of stray current caused by in-earth galvanic action.

4 Claims, 2 Drawing Figures

DIGITAL DISPLAY OHMMETER

This invention relates to an apparatus and method for measuring the continuity and resistance of electric wire circuits used in blasting with electric blasting caps and explosives in mining and like operations and, more particularly, relates to improvements to the galvanometer used to measure the continuity and resistance of these circuits and the method of using it.

In blasting circuits where a large number of individual electric blasting caps are initiated by means of an electronic firing signal, up to several hundreds of meters or even a kilometer of electric wire conductor may be employed in the circuit. In the environment of the blasting location, for example, in an underground mine, it is critically important to test the continuity and resistance of the circuit before blasting is undertaken to ensure that all blasting caps are connnected for initiation and that no short circuits exist in the wiring network. Generally, electric wire circuit testing is accomplished by applying a voltage to the circuit of such low amplitude that there is no danger of igniting the attached blasting caps. The instrument of choice for such circuit testing is commonly called the blasting galvanometer by which a constant current of low intensity, generated by a cell, is passed through the circuit. The current flow activates a pivoted indicator needle against a scale, which scale is adapted to show the resistance of the circuit in ohms.

There are often galvanic currents caused by the presence of nitrate salts or the like in the metallic ore of the blasting location. These currents cause voltages to develop across the firing circuit that cause error in the ohmmeter readings. The voltages are low and not dangerous but they do affect measurements taken by ohmmeters. The voltages vary slowly with respect to time. They usually have a rate of between 2 to 5 cycles per second. They are essentially d.c As is well known to those who are engaged with blasting work, there are also stray currents due to radio and like transmission, local electrical machinery and electrical storms. One does not operate a blasting circuit in the presence of these stray currents because of dangers. During blasting radio transmission and power machinery is turned off and electrical storm conditions are avoided.

The only type of ground current that cannot be removed during blasting is the current caused by galvanic action and it is the purpose of this invention to provide a circuit testing apparatus and a measurement method that measures the resistance of an electrical blasting circuit while minimizing the effect of the voltages due to galvanic currents.

The invention is concerned with an apparatus for measuring the continuity and resistance of an electric wire blasting network of the type where a constant current is passed through the network and a reference resistor; and the voltages across the reference resistor and the network are measured and compared to derive the resistance of the blasting circuits; the apparatus including a converter for sensing the measured voltages and converting their values to display resistance of the blasting network directly, the improvement of means for compensating for the effect of voltages due to galvanic currents associated with the blasting network comprising: a reference resistor; a storage capacitor for voltage due to galvanic currents associated with the blasting network; an input terminal for supplying a test voltage; terminals for connection to the electric wire blasting network; switch means operable between two positions, the first position being one wherein said storage capacitor is connectible only to said blasting network to assume a charge proportional to the voltage across the blasting network due to galvanic currents in the location of the blasting network and the second one being one in which said input terminal is connectible to said blasting network through said reference resistor, and in which said reference resistor, blasting network, and voltage storage capacitor are connectible to said converter; synchronizing means for cyclically moving said switch means between said first and said second positions at a frequency at which the voltage applied to the storage condenser is substantially constant; the time constant of said storage capacitor being adapted to fully charge when said switch means is in said first position. The invention will be clearly understood after reference to the following detailed specification read in conjunction with the drawings.

The invention also contemplates a method for measuring the continuity and resistance of an electric wire blasting network wherein a constant current is cyclically passed through the network and a reference resistor; and the voltages across the reference resistor and the network are measured and compared to derive the resistance of the blasting circuits; the measured voltages are sensed with a converter and their values are converted to display resistance of the blasting network directly, and includes the improvement of compensating for the effect of voltages due to galvanic currents associated with the blasting comprising the steps of: connecting a storage capacitor to the blasting network to assume a charge proportional to the voltage across the blasting network due to only the flow of galvanic current through the network; and simultaneously passing a reference current through the reference resistor and blasting network and, while the said reference current is passing through the reference resistor and blasting network, comparing the voltage across the reference resistor with the voltage across the blasting network and storage capacitor to derive a reading of the resistance of the blasting network; the steps of connecting the storage capacitor to the blasting network and comparing the voltage across the reference resistor with the voltage across the blasting network and storage capacitor being done within a time cycle wherein the voltage across the blasting network due to the flow of galvanic currents is substantially constant.

Figure 2:
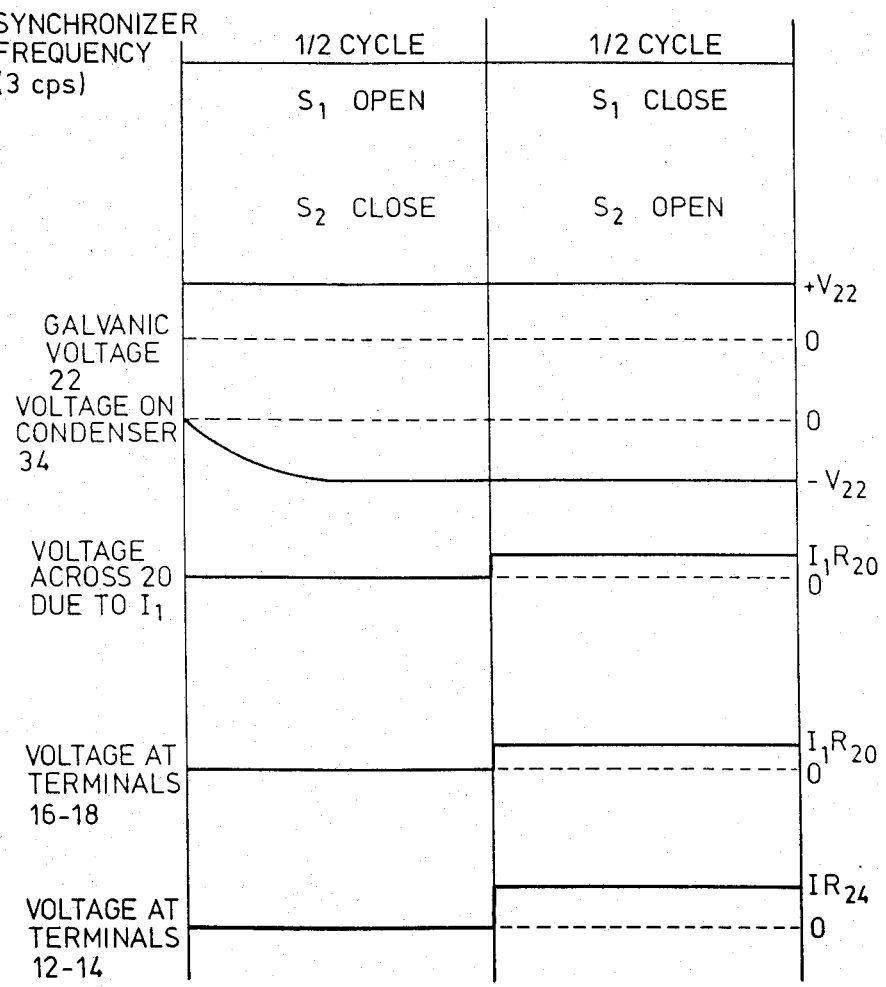

In the drawings:

FIG. 1 is a schematic illustration of apparatus in accordance with the invention; and FIG. 2 is a graph showing voltage forms at the indicated places in the apparatus in one cycle of operation of the synchronizing circuit controller.

Referring to the drawings, the numeral 10 is an analog-to-digital converter capable of converting a voltage measurement applied at its input terminals 12 and 14 and a voltage measurement applied at its input terminals 16 and 18 into a representative reading in ohms for the circuit connected to terminals 16 and 18 and display the output on a display unit 50.

The general method of measuring the resistance of a blasting circuit is to pass a low voltage d.c. current through the circuit. The current passing through the circuit is maintained constant so that a voltage measurement taken across the circuit element reflects its resistance value. Voltages are applied to the terminals 12 and 14 and the terminals 16 and 18 for the purpose of deriving the resistance of the blasting circuit as will be explained later.

In FIG. 1, numeral 20 represents the resistance of the electric wire circuit (the blasting network) used in a dynamite blasting operation in a mine or the like. Numeral 22 represents a voltage across the wire circuit due to currents in the earth caused by galvanic action. This voltage will adversely affect the accuracy of the measurement of the resistance of the electric wire circuit by the normal measuring method of measurement wherein an indication of the resistance is taken from the voltage across it under conditions of constant current due to the application of a constant external test voltage. The normal instrument contemplates the voltage across the electric wire circuit due to the application of the test voltage but not the voltages caused by the flow of galvanic currents in an ore body or the like. They introduce error into the reading.

Numeral 24 is a standard or reference resistor Numerals 26, 28, 30 and 32 are current limiting resistors. Numeral 34 is a storage capacitor having a capacity to store the electrical charges associated with the voltage 22 across the blasting network 20. Numerals 36 and 38 are switches operable between two positions in response to the synchronizing circuit controller 40, the first position being one wherein the storage capacitor 34 is connected to the blasting network 20 whereby it assumes a charge proportional to the galvanic voltage 22 associated with the blasting network and the second one being one in which the test voltage input terminal 42 is connected to the blasting network through the reference resistor 24 and in which the reference resistor, blasting network and voltage storage capacitor are connectible to the convertor 10 through terminals 12 and 14 and terminals 16 and 18. A low d.c. voltage power source, usually about 2.8 V, is connected to the terminal 42 and is taken from the 9 volt power cell 44 which is used to power the converter 10 and its associated circuit controller 40 and display unit 20.

The synchronizing circuit controller operates the switches 36 and 38 between their two positions at the rate of about three cycles per second.

The converter for taking voltage measurements at input terminals 12 and 14 and terminals 16 and 18 and deriving a value for the resistance of the firing circuit 20 is well known and not referred to in detail in this application. This invention is concerned with an improvement which corrects such a reading for the galvanic voltage 22 that is associated with the electric wire circuit 20.

The galvanic voltage 22 is essentially a d.c. voltage. For proper operation of this instrument, this voltage should be constant for at least one cycle of the operation of the synchronizing circuit controller and, in practice, it is. As noted above, galvanic currents tend to fluctuate at a rate of between 2 and 5 cycles per second. Thus, the frequency of operation of the synchronizing circuit controller should be in the range of 2 to 5 cycles per second for commonly encountered conditions. Three cycles per second has been found satisfactory. The elimination of the effect of the spurious voltage 22 in the measurement of the resistance of the firing circuit 20 is achieved in the two-step cycle of operation or the synchronizing circuit controller 40. FIG. 2 is a graph showing the position of the switches 36 and 38 as they respond to the operation of the circuit controller over a complete cycle of operation of the circuit controller and typical voltages across the storage capacitor, input terminals 16 and 18, input terminals 12 and 14 and the firing circuit 20.

During the first half-cycle of a cycle of operation of the circuit controller, switch 36 is open so that there is no supply voltage applied from terminal 42 to the firing circuit 20 and switch 38 is closed so that the storage condenser, 34 is connected directly across the firing circuit 20. There is a galvanic voltage 22 due to ground currents, indicated by the line 46 on FIG. 2 having a value of $+V_{22}$. In practise, this is small and in the order of two volts. This voltage charges the storage condenser 34 with a voltage having a maximum value of $-V_{22}$ as indicated by the line 48 on FIG. 2. Capacitor 34 must have a time constant shorter than the half-cycle so that it can fully charge within the half-cycle. When the steady state is reached, there is no current flowing in the balance of the first half-cycle. FIG. 2 is a representation of the voltage forms.

In the second half-cycle, switch 36 is closed and switch 38 is opened. Under these conditions, current $I_1$ flows through reference resistor 24 and the resistance of the electric wire circuit 20 producing a voltage $I_1R_{24}$ across the reference resistor and a voltage $I_1R_{20}$ across the electric wire circuit.

The voltage across the terminals 12 and 14 is $I_1R_{24}$ and it is constant so long as the current remains constant. The voltage across the input terminals 16 and 18 is $I_1R_{20}$ plus the voltage due to sor 34 previously stored from the first cycle $-V_{22}$. It will be apparent that the $+V_{22}$ and that the $-V_{22}$ cancel and that the net voltage appearing at terminal 16 and 18 during the second cycle is the result of the voltage drop across firing circuit 20, $I_1R_{20}$ which is constant so long as I remains constant and not dependent in any way upon the voltage 22 due to galvanic currents Thus, the reference voltages at terminals 12 and 14 and the measured voltages at terminals 16 and 18 put to the converter 10 are independent of any voltages caused by galvanic currents and associated with the firing circuit. They accurately reflect the value of the resistance of the firing circuit. The converter effectively compares the resistance of the reference resistor 24 with the measured resistance of the firing circuit 20 at the frequency of operation of the synchronizing circuit controller 40 to give an ohmic value of resistance for the blasting circuit at the display 20. The operation of the converter is well known and not described in further detail Apart from the operation of the compensating means described herein, the operation of the ohmmeter is standard and well known.

Embodiments of the invention other than the one illustrated will be apparent to those skilled in the art. The important thing about the invention is the sequential storing of the effect of the stray voltage associated with the firing circuit on a condenser and then using that stored charge to cancel out the voltage that is spurious and is associated with the firing circuit under conditions where it is compared to the reference resistor as an indication of the resistance of the firing circuit

I claim:

1. In an apparatus for measuring the continuity and resistance of an electric wire blasting network of the type where a constant current is passed through the network and a reference resistor; and the voltages across the reference resistor and the network are measured and compared to derive the resistance of the blasting circuits; the apparatus including a converter for sensing the measured voltages and converting their values to display resistance of the blasting network directly, the improvement of means for compensating for the effect of voltages due to galvanic currents associated with the blasting network comprisng:

a reference resistor;

a storage capacitor for voltage due to galvanic currents associated with the blasting network;

an input terminal for supplying a test voltage;

terminals for connection to the electric wire blasting network;

switch means operable between two positions, the first position being one wherein said storage capacitor is connectible only to said blasting network to assume a charge proportional to the voltage across the blasting network due to galvanic currents in the location of the blasting network and the second one being one in which said input terminal is connectible to said blasting network through said reference resistor, and in which said reference resistor, blasting network, and voltage storage capacitor are connectible to said converter;

synchronizing means for cyclically moving said switch means between said first and said second positions at a frequency at which the voltage applied to the storage condenser is substantially constant; and the time constant of said storage capacitor being adapted to fully charge when said switch means is in said first position.

2. Apparatus for measuring continuity and resistance of an electric wire blasting network as claimed in claim 1 in which said synchronizing means cyclically moves said switch means at a frequency of two to five cycles per second.

3. In a method for measuring the continuity and resistance of an electric wire blasting network wherein a constant current is cyclically passed through the network and a reference resistor; and the voltages across the reference resistor and the network are measured and compared to derive the resistance of the blasting circuits; the measured voltages are sensed with a converter and their values are converted to display resistance of the blasting network directly, the improvement of compensating for the effect of voltages due to galvanic currents associated with the blasting comprising the steps of:

connecting a storage capacitor to the blasting network to assume a charge proportional to the voltage across the blasting network due to only the flow of galvanic current through the network; and simultaneously passing a reference current through the reference resistor and blasting network and, while the said reference current is passing through the reference resistor and blasting network, comparing the voltage across the reference resistor with the voltage across the blasting network and storage capacitor to derive a reading of the resistance of the blasting network; and the steps of connecting the storage capacitor to the blasting network and comparing the voltage across the reference resistor with the voltage across the blasting network and storage capacitor being done within a time cycle wherein the voltage across the blasting network due to the flow of galvanic currents is substantially constant.

4. In a method for measuring the continuity and resistance of an electric wire blasting network wherein a constant current is cyclically passed through the network and a reference resistor; and the voltages across the reference resistor and the network are measured and compared to derive the resistance of the blasting circuits; the measured voltages are sensed with a converter and their values are converted to display resistance of the blasting network directly, the improvement of compensating for the effect of voltages due to galvanic currents associated with the blasting comprising the steps claimed in claim 3 wherein the time cycle of the steps of connecting the storage capacitor to the blasting network and comparing the voltage across the reference resistor with the voltage across the blasting network and storage condenser is between $\frac{1}{3}$ and 1/5 of a second.

* * * * *